(12) United States Patent
Hirano et al.

(10) Patent No.: US 11,052,455 B2
(45) Date of Patent: Jul. 6, 2021

(54) CAULKING JIG AND MANUFACTURING METHOD USING SAME

(71) Applicant: NHK SPRING CO., LTD., Yokohama (JP)

(72) Inventors: Satoshi Hirano, Isehara (JP); Arata Tatsumi, Isehara (JP); Takatoshi Nanbu, Isehara (JP)

(73) Assignee: NHK SPRING CO., LTD., Kanagawa (JP)

( * ) Notice: Subject to any disclaimer, the term of this patent is extended or adjusted under 35 U.S.C. 154(b) by 280 days.

(21) Appl. No.: 16/109,372

(22) Filed: Aug. 22, 2018

(65) Prior Publication Data

US 2018/0361464 A1 Dec. 20, 2018

(30) Foreign Application Priority Data

Feb. 24, 2016 (JP) .............................. JP2016-032963

(51) Int. Cl.
*B21J 15/48* (2006.01)
*H01L 21/687* (2006.01)
(Continued)

(52) U.S. Cl.
CPC .............. *B21J 15/48* (2013.01); *B21D 39/00* (2013.01); *B23P 19/04* (2013.01); *G05B 19/402* (2013.01);
(Continued)

(58) Field of Classification Search
CPC ........ B21D 39/00; B21D 28/02; B21D 28/10; B21D 28/14; B21D 28/145; B21D 28/22;
(Continued)

(56) References Cited

U.S. PATENT DOCUMENTS 2,917,960 A * 12/1959 Gargrave ............... B21D 28/34
83/128
4,919,614 A 4/1990 Kitagawa et al.
(Continued)

FOREIGN PATENT DOCUMENTS

DE       9112742 U1 * 11/1992 ............... B25D 5/00
FR       503677 A  *  6/1920 ............... B25D 5/02
(Continued)

OTHER PUBLICATIONS

Korean Office Action (and English language translation thereof) dated Dec. 23, 2019 issued in counterpart Korean Application No. 10-2018-7024041.
(Continued)

*Primary Examiner* — Shelley M Self
*Assistant Examiner* — Jared O Brown
(74) *Attorney, Agent, or Firm* — Holtz, Holtz & Volek PC

(57) ABSTRACT

A caulking jig comprises a main body, a blade portion having a blade edge, a projection member fit in the main body, an urging member which urges the projection member, and an engagement mechanism configured to engage the projection member to the main body. In a state in which the projection member is not engaged, the projection member is held at a projected position where a distal end portion of the projection member is projected from the blade edge. In a state in which the projection member is engaged, the projection member is held at an entered position where the distal end portion is retracted to a more entered position than the blade edge.

16 Claims, 14 Drawing Sheets

(51) Int. Cl.
*G05B 19/402* (2006.01)
*G05B 19/409* (2006.01)
*B23P 19/04* (2006.01)
*B21D 39/00* (2006.01)

(52) U.S. Cl.
CPC ........ *G05B 19/409* (2013.01); *H01L 21/6875* (2013.01); *H01L 21/68735* (2013.01); *H01L 21/68757* (2013.01); *H01L 21/68785* (2013.01)

(58) Field of Classification Search
CPC . B21D 31/02; B21J 15/38; B21J 15/48; B21J 5/068; B21K 25/00; B23P 19/04; B25D 5/00; B25D 5/02
USPC ....... 83/123–128; 72/325, 332, 481.3, 481.4, 72/482.92
See application file for complete search history.

(56) References Cited

U.S. PATENT DOCUMENTS

| | | | |
|---|---|---|---|
| 7,503,980 B2 | 3/2009 | Kida et al. | |
| RE43,837 E | 12/2012 | Kida et al. | |
| 9,490,150 B2 | 11/2016 | Tzu et al. | |
| 2007/0157466 A1 | 7/2007 | Kida et al. | |
| 2012/0312131 A1* | 12/2012 | Necer | B25D 5/02 81/463 |
| 2014/0008349 A1 | 1/2014 | Tzu et al. | |

FOREIGN PATENT DOCUMENTS

| | | | |
|---|---|---|---|
| GB | 877081 A * | 9/1961 | ............... B25D 5/00 |
| JP | S56176133 U | 12/1981 | |
| JP | 63193833 U | 12/1988 | |
| JP | 01092380 U | 6/1989 | |
| JP | H1148044 A | 2/1999 | |
| JP | H0739539 Y2 | 9/1999 | |
| JP | 2007180246 A | 7/2007 | |
| JP | 4629574 B2 | 11/2010 | |
| JP | 2013018072 A | 1/2013 | |
| TW | 201404922 A | 2/2014 | |

OTHER PUBLICATIONS

Taiwanese Office Action (and partial English translation thereof) dated Jun. 26, 2018 issued in counterpart Taiwanese Application No. 106105780.
International Search Report (ISR) (and English language translation thereof) dated May 9, 2017 issued in International Application No. PCT/JP2017/005370.
Written Opinion dated May 9, 2017 issued in International Application No. PCT/JP2017/005370.

* cited by examiner

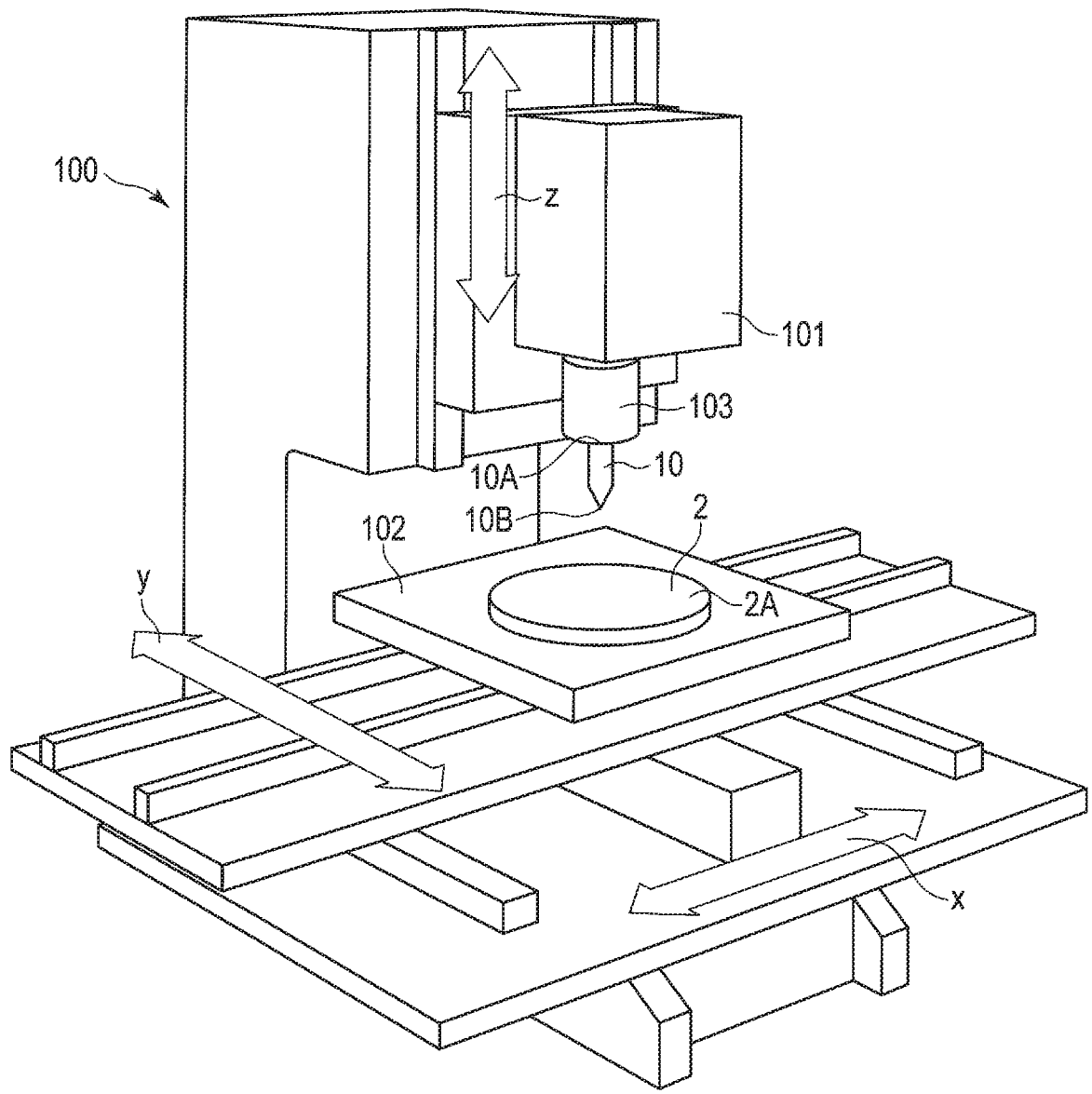
F I G. 3

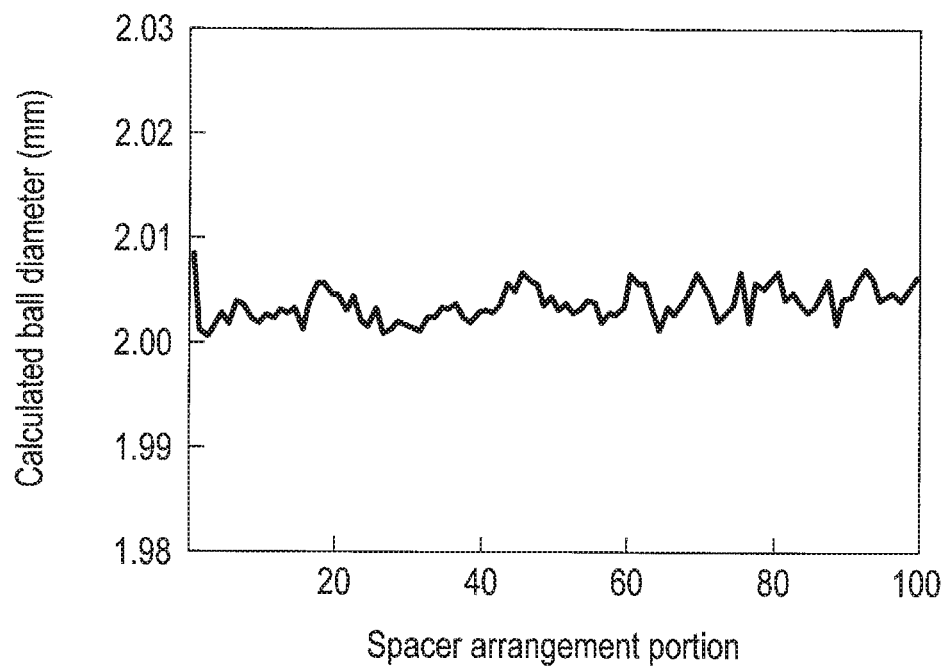
F I G. 12
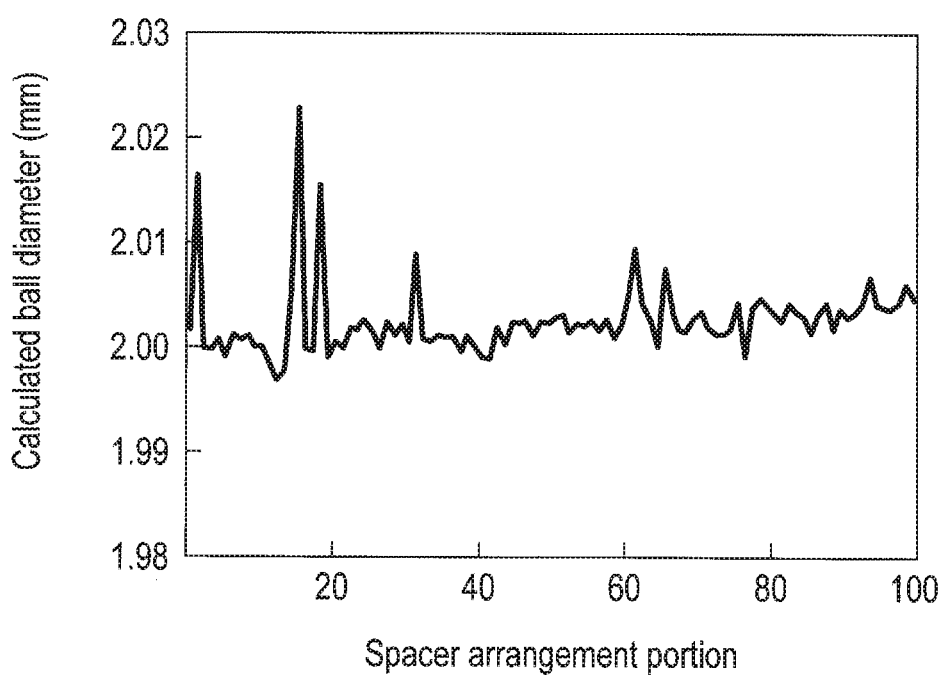
F I G. 13

CAULKING JIG AND MANUFACTURING METHOD USING SAME

CROSS-REFERENCE TO RELATED APPLICATIONS

This application is a Continuation Application of PCT Application No. PCT/JP2017/005370, filed Feb. 14, 2017 and based upon and claiming the benefit of priority from prior Japanese Patent Application No. 2016-032963, filed Feb. 24, 2016, the entire contents of all of which are incorporated herein by reference.

BACKGROUND OF THE INVENTION

1. Field of the Invention

The present invention relates to a caulking jig which processes a substrate supporting apparatus used to perform heat treatment, etc., of a semiconductor wafer, and a method of manufacturing the substrate supporting apparatus using the caulking jig.

2. Description of the Related Art

In semiconductor manufacturing processes, a substrate supporting apparatus having a heating function, etc., is used to heat-treat a substrate such as a wafer. The substrate supporting apparatus comprises a plate member in which a heater unit is incorporated, and places a substrate on an upper surface of the plate member and heats the same.

Should there be any fine particles or the like, which may become a cause of contamination, on the plate member, the fine particles or the like adhere to a back surface of the substrate that is closely attached to the plate member, and the quality of a semiconductor is impaired. In order to solve such a problem, a semiconductor supporting apparatus capable of performing heat treatment without bringing the substrate into intimate contact with the plate member, which is enabled by providing a small gap between the substrate and the plate member, has been proposed (for example, refer to JP 4629574 B).

The substrate supporting apparatus comprises a metallic plate member having a flat upper surface, holes formed at multiple places on the upper surface of the plate member, and a spherical spacer member accommodated in each hole. In the spacer member, an upper end portion of the spacer member is slightly projected from the upper surface of the plate member, and removal (slip off) prevention of the spacer member is achieved by a caulking portion formed by plastically deforming an opening edge portion of the hole.

If a hole having a uniform depth is formed by an NC machine tool by using a spacer member which is highly accurate in dimension, the height of the upper end portion of the spacer member projected from the upper surface of the plate member should be uniform. However, if the caulking portion is formed in a state in which the spacer member does not contact the bottom of the hole, the heights of the upper end portions of the respective spacer members are varied by the presence of a gap between the spacer member and the bottom of the hole. Correcting the position of the spacer member one by one by the operator's hand to make the spacer member contact the bottom of the hole is very troublesome.

BRIEF SUMMARY OF THE INVENTION

An object of the present invention is to provide a caulking jig to which an NC machine tool can be applied because the height of a blade portion can be calibrated in a state in which a projection member is retracted, and by which the height of an upper end portion of a spacer member can be made uniform by subjecting an edge portion of a hole to plastic deformation in a state in which a position of the spacer member is corrected.

According to an embodiment, the caulking jig comprises a cylindrical main body, a blade portion having a sharp V-shaped blade edge, a projection member, an urging member, and an engagement mechanism. The urging member urges the projection member in a direction of projecting the projection member from the blade portion. The engagement mechanism is configured to engage the projection member on the main body. The projection member is internally fit in the main body. In a state in which the projection member is not engaged by the engagement mechanism, the projection member is held at a projected position where a distal end portion of the projection member is projected from the blade edge by the urging force of the urging member. In a state in which the projection member is engaged by the engagement mechanism, the projection member is held at an entered position where the distal end portion is retracted to a more entered position than the blade edge against the urging force of the urging member.

Here, the projection member may further include a shoulder portion formed to have a diameter larger than a diameter of the distal end portion. The engagement mechanism may include an engagement hole and an engagement pin. The engagement hole is formed in the main body, is positioned on a plane orthogonal to a central axis of the main body, and penetrates the main body at a position of a chord not intersecting the central axis. When the engagement pin is inserted in the engagement hole, the engagement pin contacts the shoulder portion of the projection member from a side opposite to a direction in which the urging member urges the projection member.

The distal end portion of the projection member may be formed such that it is recessed toward a proximal end. A load sensor which measures a load exerted on the projection member against the urging force of the urging member may further be provided. The load sensor may be configured to detect whether the projection member is in contact with a spacer member.

The projection member may include a through-hole which is penetrated from a distal end to the proximal end. A vacuum source connected to the projection member may further be provided. A vacuum sensor which measures a degree of vacuum of the through-hole may further be provided. The vacuum source may be configured to cause the spacer member to be adsorbed to the distal end portion through the through-hole. By the vacuum sensor, whether the spacer member is adsorbed to the distal end portion can be detected. An optical sensor connected to the projection member may further be provided. The optical sensor may be configured to detect whether the spacer member is arranged on an extension of the distal end portion by measuring a reflectivity through the through-hole.

According to the present embodiment, a method of manufacturing a semiconductor wafer supporting apparatus comprises a perforation step, a spacer arrangement step, a jig mounting step, a jig position correction step, a spacer position correction step, and a caulking step. In the perforation step, a plurality of holes are formed in a flat upper surface of a metallic plate member. In the spacer arrangement step, spacer members are inserted into the holes, respectively. In the jig mounting step, a caulking jig is mounted on an NC machine tool. The caulking jig comprises a blade portion, and a projection member urged in a direction of being projected from the blade portion. In the jig position correction step, a height of the blade portion is calibrated in a state in which the projection member is retracted to a more entered position than the blade portion. Based on a result of this calibration, a setting of a predetermined caulking position is input to the NC machine tool. In the spacer position correction step, the caulking jig is lowered in a state in which the projection member is projected from a blade edge. Further, the spacer member is pressed by the projection member, and is made to contact a bottom of the hole. In the caulking step, the blade portion is further lowered to the caulking position against the urging force of the projection member. Further, the spacer member is fixed by plastically deforming an edge portion of the hole by the blade portion.

In the spacer position correction step, whether or not the spacer member is accommodated in the hole may be detected, and when the spacer member is not accommodated, lowering of the caulking jig may be suspended by not proceeding to the caulking step.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3 is a perspective view showing the state in which a caulking jig is mounted on an NC machine tool.

FIG. 12 is an illustration showing a calculated ball diameter of a spacer member of the substrate supporting apparatus obtained by the manufacturing method of the present invention.

FIG. 13 is a graph showing a calculated ball diameter in a substrate supporting apparatus in which an edge portion of a hole is plastically deformed without correcting a position of the spacer member.

DETAILED DESCRIPTION OF THE INVENTION

First, a substrate supporting apparatus manufactured by the present invention will be explained with reference to FIGS. 1 and 2.

Figure 1:
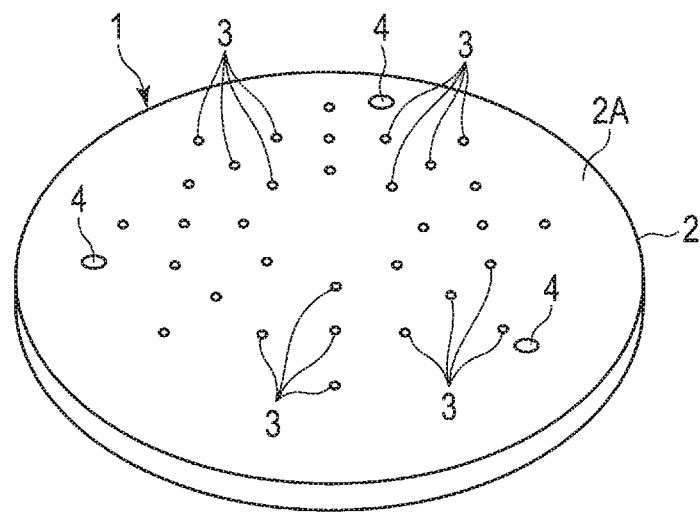
FIG. 1 is a perspective view showing a substrate supporting apparatus according to each embodiment.

As shown in FIG. 1, a substrate supporting apparatus 1 manufactured by the present invention comprises a disc-shaped plate member 2 made of metal such as aluminum alloy. A heater unit is incorporated in the plate member 2, and the heater unit can heat a substrate such as a semiconductor wafer placed on an upper surface 2A to a predetermined temperature.

The upper surface 2A is finished flat by machining or the like, and is provided with a plurality of spacer arrangement portions 3 and a plurality of through-holes 4. Ejector pins for pushing up the substrate placed on the upper surface 2A are inserted into the through-holes 4 from below.

Figure 2:
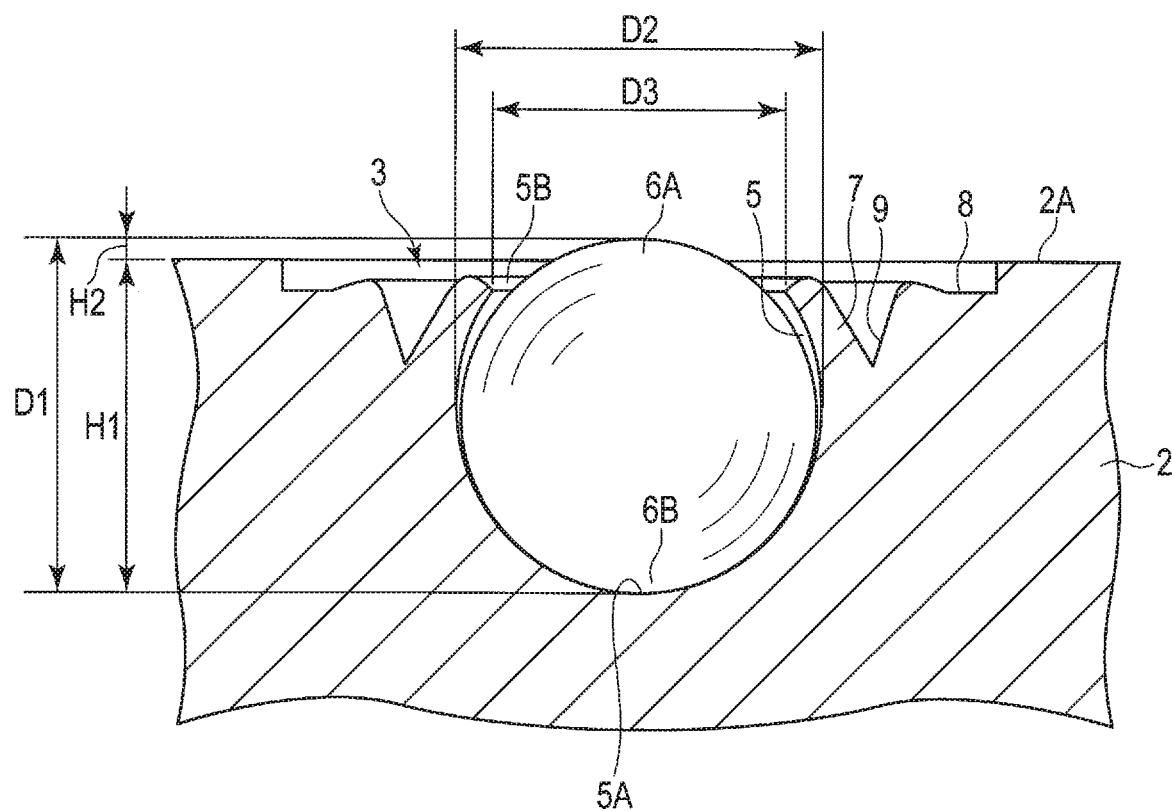
FIG. 2 is a cross-sectional view showing details of a spacer arrangement portion shown in FIG. 1.

FIG. 2 is a cross-sectional view showing details of the spacer arrangement portion 3. As shown in FIG. 2, the spacer arrangement portion 3 includes a closed-end hole 5 formed in the upper surface 2A, a spacer member 6 accommodated in this hole 5, and a caulking portion 7 which holds the spacer member 6 so that it does not slip out of the hole 5.

An example of the spacer member 6 is a sphere made of sapphire. Note that the material of the spacer member is not limited to sapphire. In other words, the other corundum such as ruby, or a sphere made of the other ceramic material such as silicon carbide and aluminum nitride may be used. Any other shape having a diameter, such as a shape of a column, a cannon ball, a cone, may be adopted. A diameter D1 of the spacer member 6 is, for example, 2.000 mm. If the shape of the spacer member 6 is a sphere, a member that is highly accurate in dimension can be procured easily.

A bottom 5A of the hole constitutes a semispherical recess. An edge portion 5B of the hole 5 is circular as seen from above. An inner diameter D2 of the hole 5 is slightly larger than the diameter D1 of the spacer member 6. The inner diameter D2 of the hole 5 is a dimension which is not below the diameter D1 of the spacer member 6 even if the plate member 2 is thermally contracted after cooling. A depth H1 of the hole is slightly smaller than the diameter D1 of the spacer member 6. The depth H1 of the hole is, for example, 1.87 to 1.88 mm.

An upper end portion 6A of the spacer member 6 contacts a back side of the substrate, and forms a small gap between the substrate and the plate member 2. The upper end portion 6A of the spacer member 6 projects from the upper surface 2A of the plate member 2 by a height H2. If a lower end portion 6B of the spacer member 6 is made to contact the bottom 5A of the hole 5, the height H2 of the spacer member 6 can be accurately restricted.

The caulking portion 7 is formed by plastically deforming the edge portion 5B by a caulking jig 10, which will be described later, such that an opening width D3 of the edge portion 5B becomes smaller than the diameter D1 of the spacer member 6. The opening width D3 is formed in a dimension that does not exceed the diameter D1 of the spacer member 6 even if the plate member 2 is heated and thermally expanded.

In the example illustrated in FIG. 2, the spacer arrangement portion 3 further comprises a flat spot facing portion 8, and a groove 9 having a V-shaped cross section. The spot facing portion 8 is formed to surround the hole 5. The groove 9 is formed along an outer circumference of the caulking portion 7. Note that the spot facing portion 8 and the groove 9 are not essential elements. In the following explanation, a blade edge 12A of the caulking jig 10 contacting the upper surface 2A of the plate member 2 includes a case where the blade edge 12A of the caulking jig 10 contacts the spot facing portion 8.

First Embodiment

The caulking jig 10 of a first embodiment of the present invention will be explained with reference to FIGS. 3 to 6.

FIG. 3 is a perspective view showing the state in which the caulking jig 10 is mounted on a numerically controlled (NC) machine tool 100. In the present embodiment, as shown in FIG. 3, a first direction (crosswise direction) X, a second direction (front-to-back direction) Y, and a third direction (vertical direction) Z will be defined. The NC machine tool 100 comprises a spindle head 101 movable in the third direction Z, and a table 102 movable in the first and second directions X and Y.

The spindle head 101 comprises a main shaft 103 which is rotatable. On the main shaft 103, the caulking jig 10 is fixed such that a longitudinal direction of the caulking jig 10 corresponds to the third direction Z. In the caulking jig 10, an end on a side fixed to the NC machine tool 100 is referred to as a proximal end 10A, and the other end on a side opposite to the proximal end 10A will be referred to as a distal end 10B. Further, a side closer to the proximal end 10A will be referred to as a proximal end side, and a side closer to the distal end 10B will be referred to as a distal end side.

Figure 4:
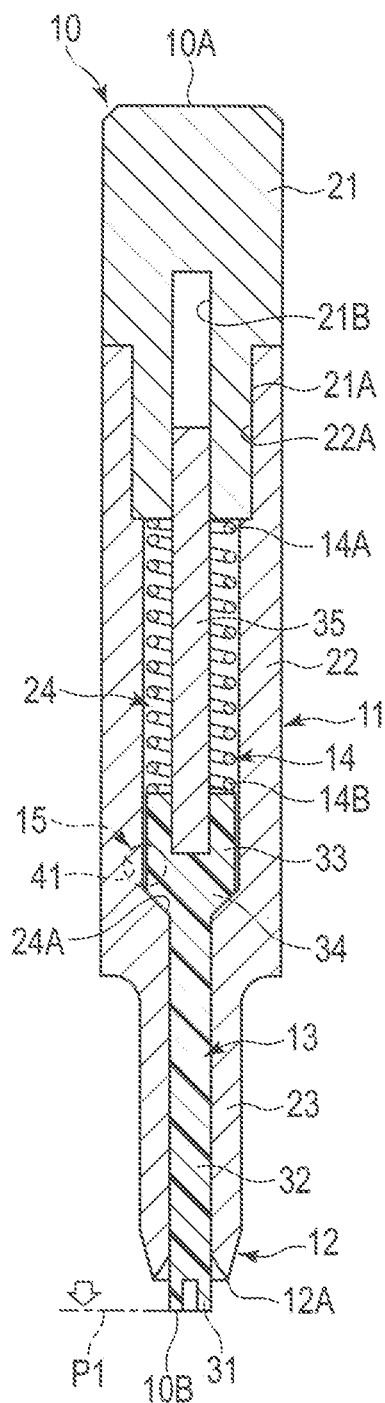
FIG. 4 is a cross-sectional view showing the caulking jig of a first embodiment.
Figure 5:
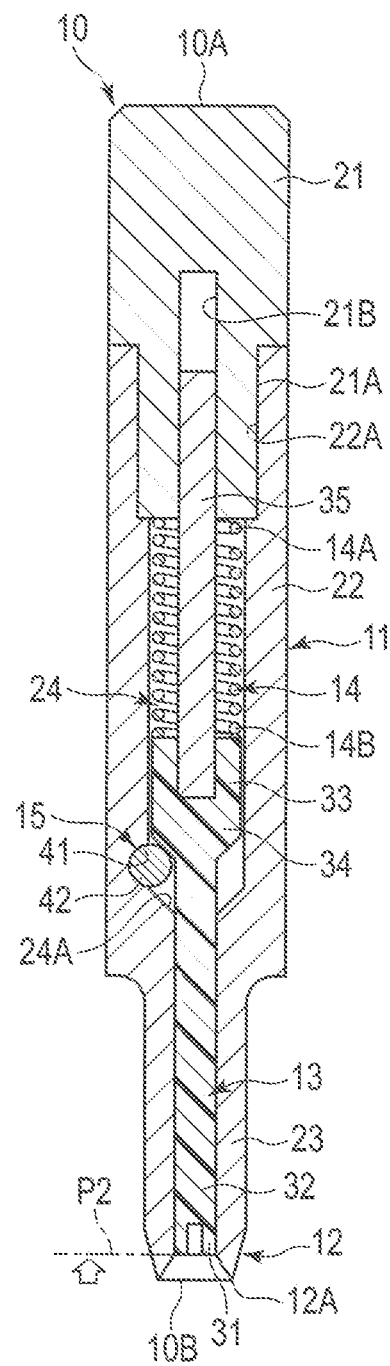
FIG. 5 is a cross-sectional view showing the state in which a projection member shown in FIG. 3 is held at an entered position.

FIGS. 4 and 5 are cross-sectional views of the caulking jig 10, and FIG. 4 shows the state in which a projection member 13 is held at a projected position P1, and FIG. 5 shows the state in which the projection member 13 is held at an entered position P2. As shown in FIG. 4, the caulking jig 10 comprises a main body 11, a blade portion 12, the projection member 13, an urging member 14, and engagement mechanism 15 used as necessary.

The main body 11 is formed into a cylindrical shape extending from the proximal end 10A of the caulking jig 10 to the blade portion 12. In the example shown in FIG. 4, the main body 11 includes a cover portion 21 including the proximal end 10A of the caulking jig 10, a diameter expansion portion 22 connected to the cover portion 21, and a diameter reduction portion 23 connected to the diameter expansion portion 22 from a side opposite to the cover portion 21.

The cover portion 21 is formed into a columnar shape, and an external thread 21A is provided on an outer peripheral surface near the distal end. On a side opposite to the proximal end 10A of the cover portion 21, a bearing hole 21B recessed toward the proximal end 10A is formed.

The diameter expansion portion 22 is formed into a cylindrical shape having a diameter equal to that of the cover portion 21, and an internal thread 22A is provided on an inner peripheral surface near the proximal end. The internal thread 22A is fastened to the external thread 21A of the cover portion 21. An internal space 24 is delimited by the cover portion 21 of the main body 11 and the diameter expansion portion 22. In the internal space 24, the proximal end side is closed by the cover portion 21, and the distal end side is formed to be tapered, and communicates with the outside via the diameter reduction portion 23. On a side closer to the distal end of the internal space 24, an inclined plane 24A is formed.

The diameter reduction portion 23 is formed into a cylindrical shape having a diameter smaller than that of the diameter expansion portion 22, and connects the diameter expansion portion 22 and the blade portion 12.

The blade portion 12 constitutes a distal end portion of the caulking jig 10, and is formed into an annular shape having a diameter equal to that of the diameter reduction portion 23 of the main body 11. The blade portion 12 has a sharp V-shaped blade edge 12A on the distal end side. When the projection member 13 is positioned at the entered position P2 (FIG. 5), the blade edge 12A agrees with the distal end 10B of the caulking jig 10 in the position.

The main body 11 excluding the cover portion 21 and the blade portion 12 are formed as an integral construct. The material of the main body 11 and the blade portion 12 is, for example, metal or a ceramic material similar to the material of a cutting tool.

The projection member 13 is formed to be rod-shaped, and is internally fit in the main body 11. The projection member 13 is configured to slide between the projected position P1 shown in FIG. 4 and the entered position P2 shown in FIG. 5. The projection member 13 includes a distal end portion 31, a shaft part 32, a proximal end portion 33, a shoulder portion 34, and a guide shaft 35.

The distal end portion 31 projects outwardly from the blade edge 12A of the main body 11 when the urging member 14 is located at the projected position P1, and enters more to the inside than the blade edge 12A when the urging member 14 is located at the entered position P2. A distal end surface of the distal end portion 31 is formed such that the center is recessed toward the proximal end 10A of the caulking jig 10. The distal end surface of the distal end portion 31 agrees with the distal end 10B of the caulking jig 10 in the position when the urging member 14 is located at the projected position P1.

The shaft part 32 is formed into a long rod shape having a diameter equal to that of the distal end portion 31. The shaft part 32 is inserted into the diameter reduction portion 23 of the main body 11, and connects the distal end portion 31 and the proximal end portion 33.

The proximal end portion 33 is formed to have a diameter larger than that of the shaft part 32. The urging member 14 contacts the proximal end portion 33 from the side opposite to the shaft part 32. In the proximal end portion 33, the shoulder portion 34 is formed at the side closer to the shaft part 32. The shoulder portion 34 is formed into a conical shape which is smoothly continuous with the shaft part 32.

The guide shaft 35 penetrates through the urging member 14, and extends from the proximal end portion 33 to the cover portion 21 of the main body 11. One end of the guide shaft 35 is fixed to the proximal end portion 33. The other end of the guide shaft 35 is inserted into the bearing hole 21B of the cover portion 21.

In the example shown in FIG. 4, the material of the distal end portion 31, the shaft part 32, the proximal end portion 33, and the shoulder portion 34 is, for example, PEEK resin. As long as the material can provide superior dimensional accuracy, and does not damage the spacer member 6, various materials, not limited to the PEEK resin, can be applied. The distal end portion 31, the shaft part 32, the proximal end portion 33, and the shoulder portion 34 are formed as an integral construct. The guide shaft 35 is made of, for example, metal. Alternatively, the guide shaft 35 may be made of PEEK resin, etc., to form all of the distal end portion 31, the shaft part 32, the proximal end portion 33, the shoulder portion 34, and the guide shaft 35 as an integral construct.

The urging member 14 is formed into a cylindrical shape using an elastic member such as a coil spring and foamed plastic, and is accommodated in the internal space 24 of the main body 11. An end portion 14A on the proximal end side of the urging member 14 is supported on the cover portion 21 of the main body 11. An end portion 14B on the distal end side contacts the proximal end portion 33 of the projection member 13, and urges the projection member 13 toward the distal end 10B of the caulking jig 10.

The caulking jig 10 of the present invention comprises the engagement mechanism 15 capable of engaging the projection member 13 with the main body 11. As shown in FIG. 5, the engagement mechanism 15 comprises an engagement hole 41 and an engagement pin 42.

The engagement hole 41 is formed in the diameter expansion portion 22 of the main body 11. The engagement hole 41 is located on a plane orthogonal to a central axis of the main body 11, and is formed to penetrate the main body 11 at a position of a chord not intersecting the central axis. In the example illustrated in FIG. 4, the engagement hole 41 is formed closer to the proximal end side than the inclined plane 24A. Note that the engagement hole 41 may be formed to include a part of the inclined plane 24A. The engagement pin 42 is formed into a rod shape whose cross section is slightly smaller than that of the engagement hole 41.

When the engagement pin 42 is inserted into the engagement hole 41, the engagement pin 42 is arranged to cross the internal space 24, and contacts the shoulder portion 34 of the projection member 13 from the distal end side. By the engagement hole 41 and the engagement pin 42, the projection member 13 is restricted from moving to the distal end side and is engaged with the main body 11.

When the projection member 13 is engaged with the main body 11 by the engagement mechanism 15, the distal end portion 31 of the projection member 13 is held at the entered position P2 where it enters more to the inside than the blade edge 12A of the main body 11, against the urging force of the urging member 14.

A manufacturing method of the present invention for manufacturing the substrate supporting apparatus 1 by using the caulking jig 10 structured as described above will be explained with reference to FIGS. 6 to 11.

Figure 6:
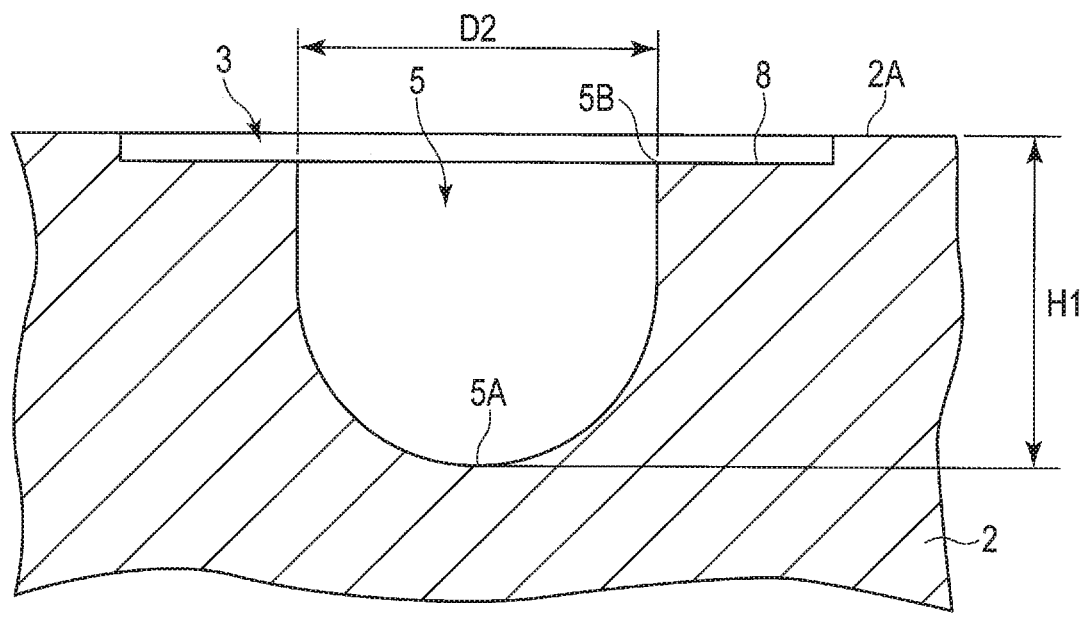
FIG. 6 is a cross-sectional view showing a perforation step included in a method of manufacturing a substrate supporting apparatus using the caulking jig of the first embodiment.

In order to manufacture the substrate supporting apparatus 1, first, as shown in FIG. 6, the hole 5 having the depth H1 and the inner diameter D2, and the spot facing portion 8 are formed on the upper surface 2A of the plate member 2 (perforation step). In the present embodiment, one hundred holes 5 are formed. Preferably, the bottom 5A should be formed semispherical, since a gap between the bottom 5A of the hole 5 and the spacer member 6 can be made small. Note that the shape of the bottom 5A is not limited to semispherical, but may be formed to be flat or formed to be conical.

Figure 7:
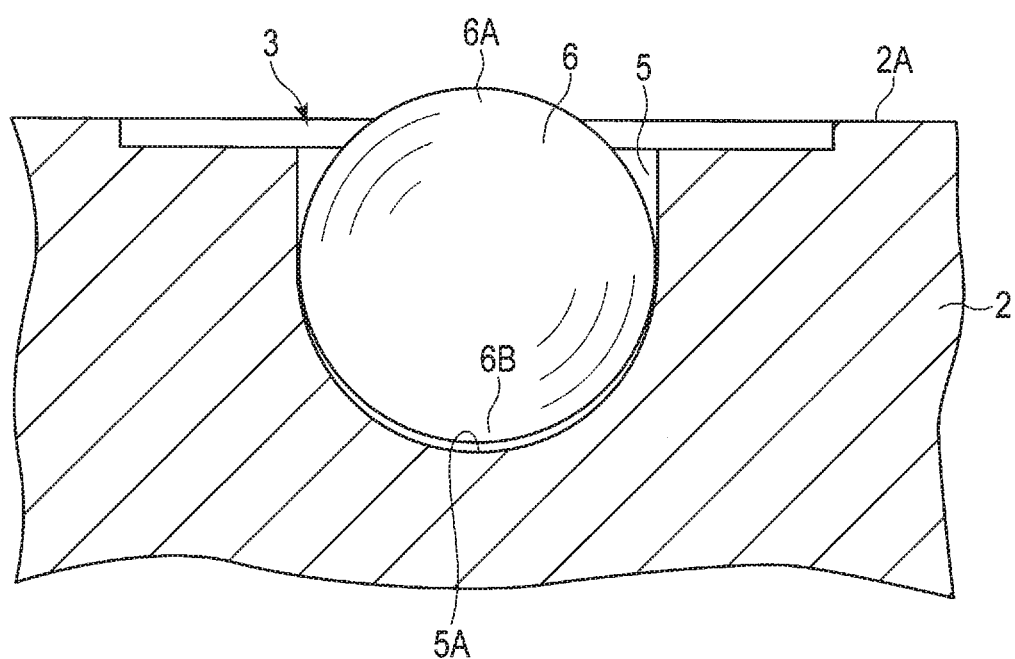
FIG. 7 is a cross-sectional view showing a spacer arrangement step subsequent to FIG. 6.

The spacer members 6, which are of the same number as the holes 5, are prepared, and as shown in FIG. 7, the spacer members 6 are inserted into the holes 5, respectively (spacer arrangement step). At this time, there may be a case where the lower end portion 6B of the inserted spacer member 6 does not contact the bottom 5A of the hole 5, and the lower end portion 6B is slightly above the bottom 5A.

Figure 8:
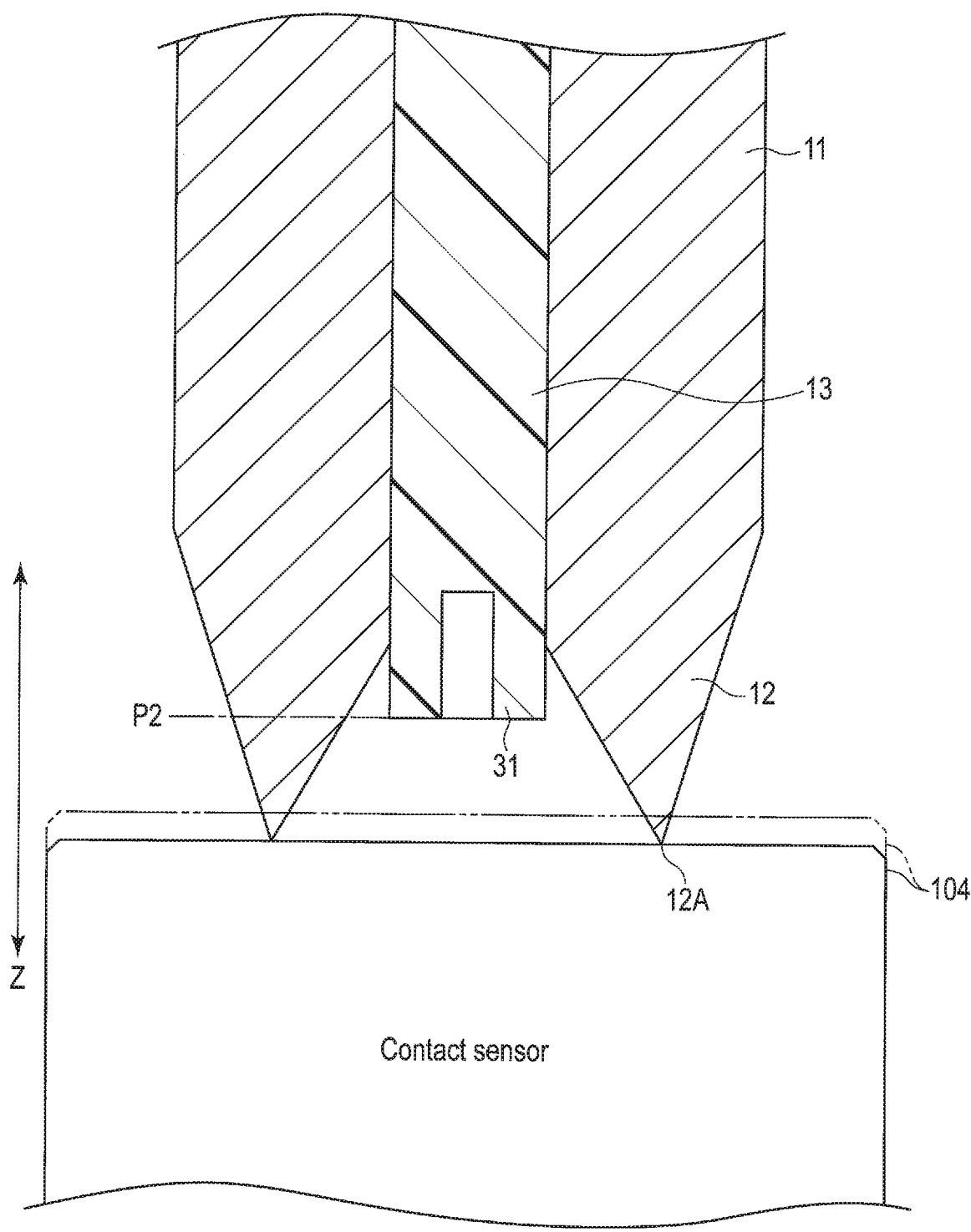
FIG. 8 is a cross-sectional view showing a jig position correction step subsequent to FIG. 7.

Next, the caulking jig 10 is mounted on the main shaft 103 of the NC machine tool 100. A contact sensor 104 is placed on the table 102 of the NC machine tool 100. As shown in FIG. 8, the spindle head 101 is lowered by operating the NC machine tool 100, and causes the blade edge 12A of the caulking jig 10 being mounted on the NC machine tool 100 to contact an upper surface of the contact sensor 104. A relative position of the blade edge 12A of the caulking jig 10 to the spindle head 101 of the NC machine tool 100 is measured by the contact sensor 104, and this is reflected on the setting on the NC machine tool 100 in terms of the third direction Z (jig position correction step).

At this time, the projection member 13 of the caulking jig 10 is held at the entered position P2 where it enters more to the inside than the blade edge 12A, and is retracted so as not to interfere with the contact sensor 104. When calibration is finished, the engagement pin 42 is removed, and the projection member 13 of the caulking jig 10 is projected outwardly from the blade edge 12A.

Figure 9:
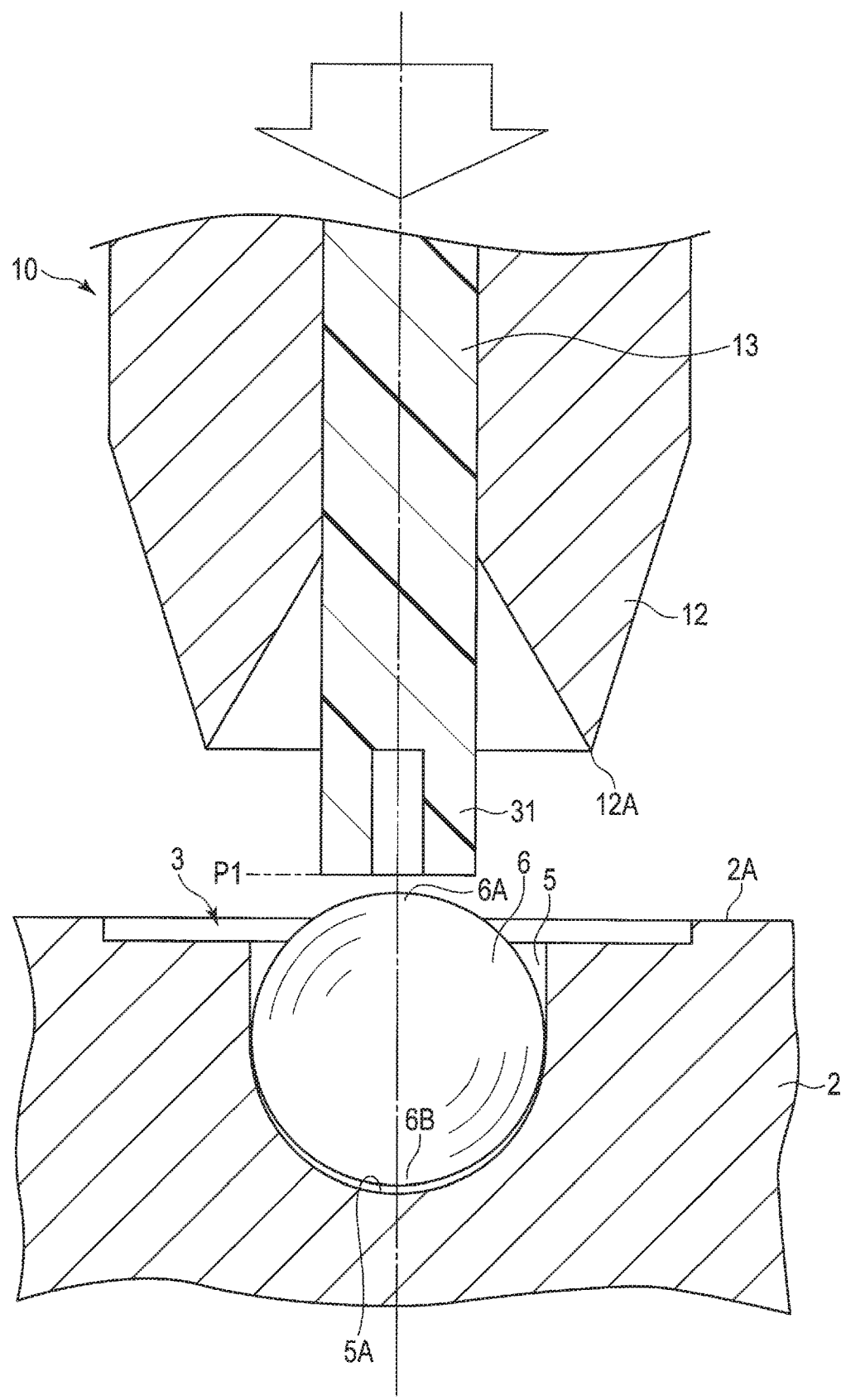
FIG. 9 is a cross-sectional view showing a part of a spacer position correction step subsequent to FIG. 8.

As shown in FIG. 3, the plate member 2 prepared in the spacer arrangement step shown in FIG. 7 is fixed to the table 102 of the NC machine tool 100, and the relative position of the plate member 2 to the table 102 is calibrated. The table 102 is moved in the first and second directions X and Y, and as shown in FIG. 9, a central axis of the caulking jig 10 fixed to the main shaft 103 is made to align with central axes of the hole 5 and the spacer member 6. The spindle head 101 is lowered, and the caulking jig 10 is brought close to the upper surface 2A of the plate member 2.

Figure 10:
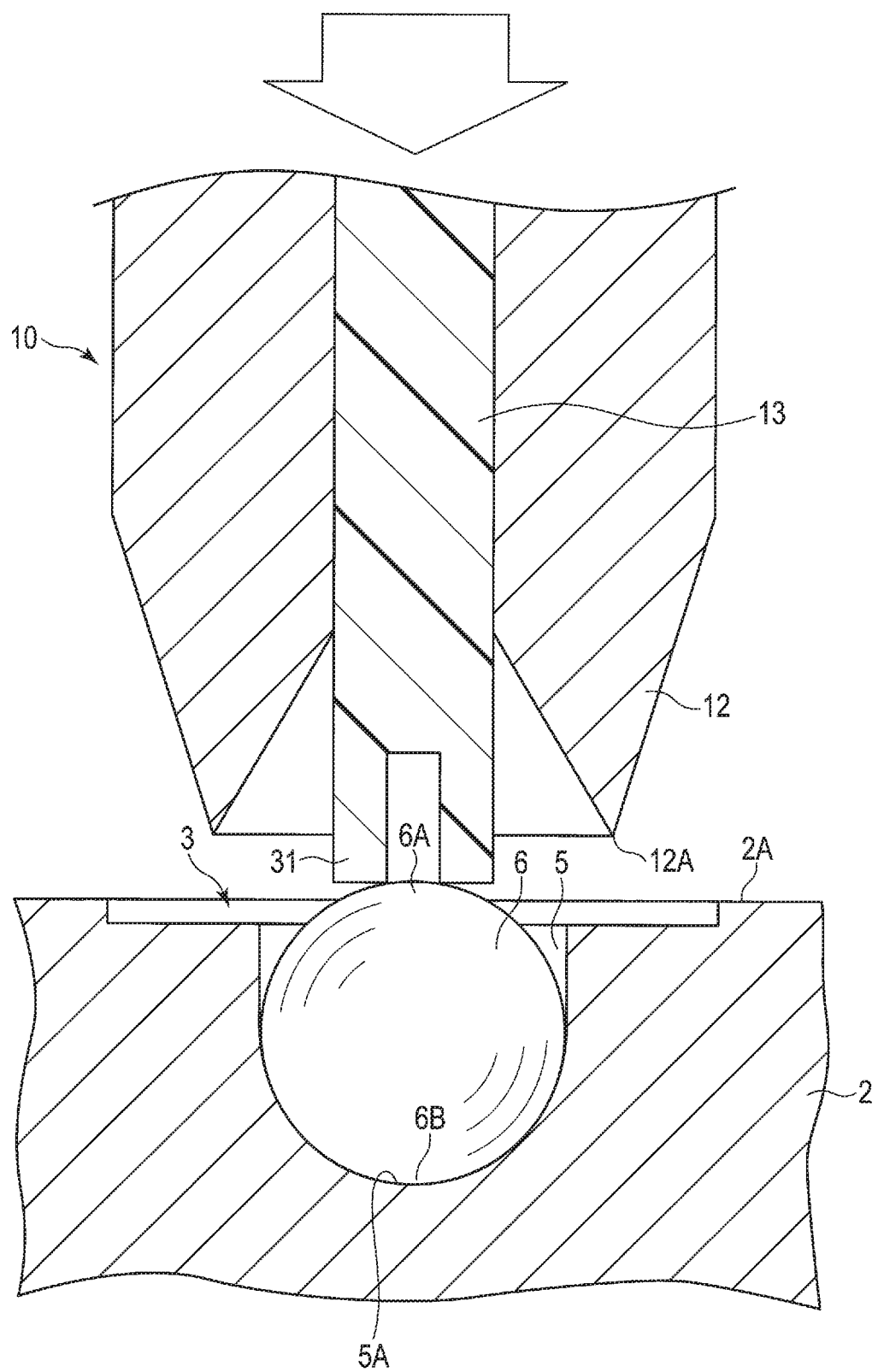
FIG. 10 is a cross-sectional view showing a part of the spacer position correction step subsequent to FIG. 9.

Then, the distal end portion 31 of the projection member 13 contacts the spacer member 6. The projection member 13 presses the spacer member 6 down to a position where the lower end portion 6B of the spacer member 6 contacts the bottom 5A of the hole 5 (spacer position correction step). Further, when the spindle head 101 is lowered, as shown in FIG. 10, the projection member 13 enters inside the main body 11 against the urging force of the urging member 14, and the blade edge 12A approximates the plate member 2.

After that, the V-shaped blade edge 12A bites into the plate member 2, and plastically deforms the edge portion 5B of the hole 5. When the spindle head 101 of the NC machine tool 100 is lowered to a predetermined position in the third direction Z, the blade edge 12A forms the groove 9 of a predetermined depth (caulking step).

In this state, in the hole 5, the caulking portion 7 which achieves removal prevention of the spacer member 6 is formed. The upper end portion 6A of the spacer member 6 projects from the upper surface 2A of the plate member 2 by the height H2.

FIG. 12 is a graph showing a calculated ball diameter in the substrate supporting apparatus 1 manufactured by the manufacturing method of the present invention. FIG. 13 is a graph showing a calculated ball diameter in a substrate supporting apparatus of a comparative example manufactured by using a caulking jig not comprising the projection member 13.

In a manufacturing method of the comparative example of FIG. 13, the spacer position correction step shown in FIGS.

9 and 10 is omitted. Further, in order to bring the spacer member 6 into contact with the bottom 5A of the hole 5, after the spacer arrangement step shown in FIG. 7, the spacer member 6 is pressed manually.

The horizontal axis in FIGS. 12 and 13 represents the first to hundredth spacer arrangement portions 3 counted spirally from the outer circumference of the plate member 2 to the center. The vertical axis represents the calculated ball diameter obtained by adding the height H2 of the upper end portion 6A of the spacer member 6 to the depth H1 of the hole 5 measured in advance with respect to the first to hundredth spacer arrangement portions 3. If the lower end portion 6B of the spacer member 6 contacts the bottom 5A of the hole 5, the calculated ball diameter becomes equal to the diameter, which is 2.000 mm, of the spacer member 6.

With the manufacturing method of the comparative example, as shown in FIG. 13, the height H2 of the upper end portion 6A of the spacer member 6 falls within an amplitude of 0.026 mm with respect to the depth H1 of the hole 5. Meanwhile, with the manufacturing method of the present invention, as shown in FIG. 12, the height H2 of the upper end portion 6A of the spacer member 6 falls within an amplitude of 0.008 mm with respect to the depth H1 of the hole 5.

According to the present invention, the amplitude of the height H2 of the upper end portion 6A of the spacer member 6 is reduced to be one third or less of the comparative example. In other words, the upper end portion 6A is projected from the upper surface 2A of the plate member 2 in such a way that the spacer member 6 is shaped more faithful to the depth H1 of the hole 5.

According to the caulking jig 10 which has been structured as above and the manufacturing method using the caulking jig 10, since the caulking jig 10 comprises the projection member 13, the edge portion 5B can be plastically deformed while correcting the spacer member 6 to be at a position contacting the bottom 5A of the hole 5 by the projection member 13. Accordingly, as shown in FIG. 12, the upper end portion 6A of the spacer member 6 can be projected with a configuration faithful to the depth H1 of the hole 5.

Incidentally, it is also possible to bring the lower end portion 6B of the spacer member 6 into contact with the bottom 5A of the hole 5 by pressing the spacer member 6 by the operator's hand without using the projection member 13 of the caulking jig 10 as in the manufacturing method of the comparative example. However, if the spacer member 6 is small and light, when the operator touches the spacer member 6 by hand, the spacer member 6 may come out of the hole 5 not provided with the caulking portion 7 and be lost. Further, if the spacer member 6 is transparent as in the sapphire ball used in the present embodiment, the presence or absence of the spacer member 6 cannot be visually checked.

Figure 11:
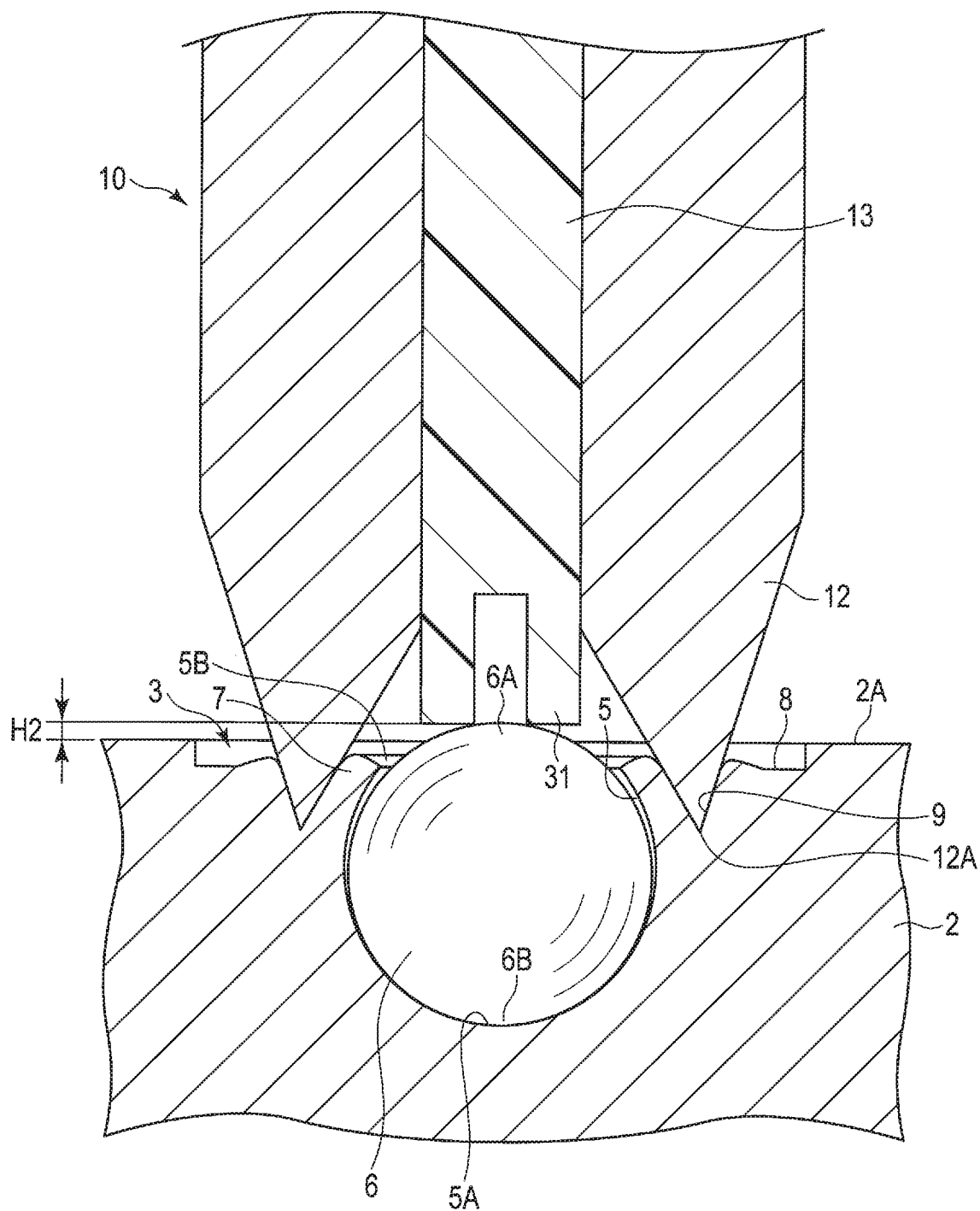
FIG. 11 is a cross-sectional view showing a caulking step subsequent to FIG. 10.

If by any chance the caulking portion 7 is formed in a state where the spacer member 6 is not accommodated in the hole 5, the substrate supporting apparatus 1 becomes a defective product. Since the plastic deformation of the edge portion 5B of the hole 5 for which the caulking portion 7 of FIG. 11 is to be formed is irreversible change, the substrate supporting apparatus 1 in which caulking has failed cannot be reused because it is not possible to replace only the defective portions. In other words, the substrate supporting apparatus 1 in whole cannot be used.

According to the present embodiment, the lower end portion 6B of the spacer member 6 can be made to contact the bottom 5A of the hole 5 reliably without using the operator's hand. Consequently, occurrence of having a defective part in the substrate supporting apparatus 1 can be suppressed. Moreover, the number of man-hours required for the other operator to check an error caused by the manual operation can be reduced. As a result, the cost can be reduced.

In the present embodiment, the caulking jig 10 comprises the engagement mechanism 15. Since the caulking jig 10 can be mounted on the NC machine tool 100 while the projection member 13 is being retained at the entered position P2 by the engagement mechanism 15, the NC machine tool 100 can be applied by calibrating the height of the blade edge 12A of the blade portion 12 in a state where the projection member 13 is retracted to the entered position P2. Since the edge portion 5B of the hole 5 can be plastically deformed by applying the NC machine tool 100, the caulking portion 7 that is highly accurate in dimension can be formed.

According to the present embodiment having both the projection member 13 and the engagement mechanism 15, the edge portion 5B of the hole 5 can be plastically deformed by applying the NC machine tool 100 in a state where the height position of the spacer member 6 is corrected by the projection member 13. Accordingly, the height H2 of the upper end portion 6A of the spacer member 6 can be made uniform.

Further, since the present embodiment has a simple structure in which the engagement mechanism 15 is formed by combining the engagement hole 41 and the engagement pin 42, the cost of the caulking jig 10 can be prevented from being increased. Since the cover portion 21 does not need to be opened by moving the external thread 21A in insertion and extraction of the engagement pin 42, a dimension from the proximal end 10A of the caulking jig 10 to the blade edge 12A does not change. Because the engagement hole 41 is provided in the main body 11 and the engagement pin 42 does not protrude from the proximal end 10A or the blade edge 12A, the engagement pin 42 does not obstruct calibration of the dimension of the caulking jig 10 in the third direction Z.

In the present embodiment, the projection member 13 is formed of a material softer than the spacer member 6. Even if the spacer member 6 is pressed by the distal end portion 31 of the projection member 13 as shown in FIG. 10, the upper end portion 6A of the spacer member 6 will not be damaged.

In the present embodiment, the distal end portion 31 is formed to be recessed toward the proximal end side. Even if the spacer member 6 is pressed by the projection member 13, since the distal end portion 31 of the projection member 13 does not directly contact the upper end portion 6A of the spacer member 6, the upper end portion 6A of the spacer member 6 will not be damaged.

Figure 14:
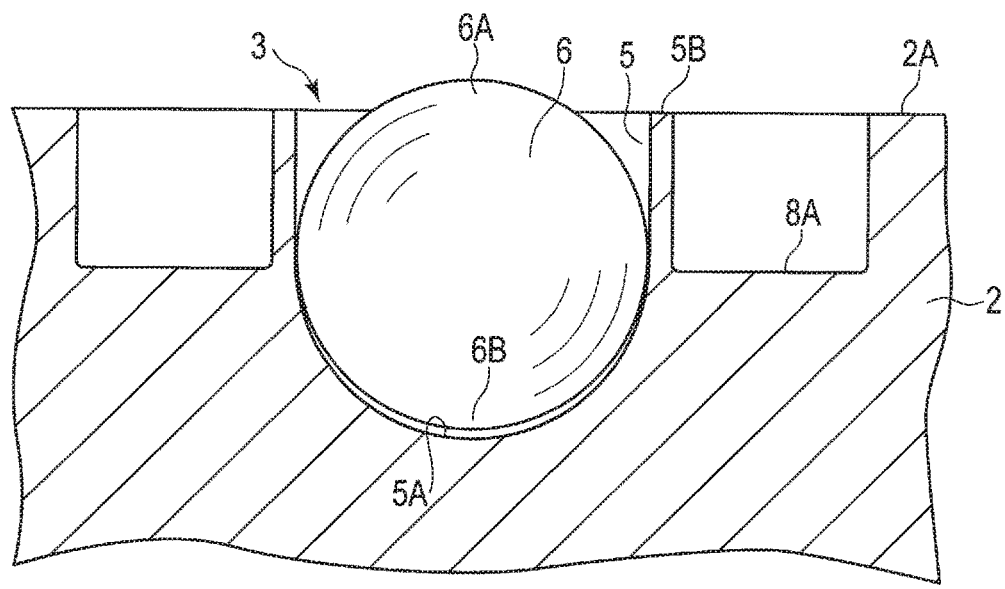
FIG. 14 is a cross-sectional view showing a modification of a hole shown in FIG. 6.
Figure 15:
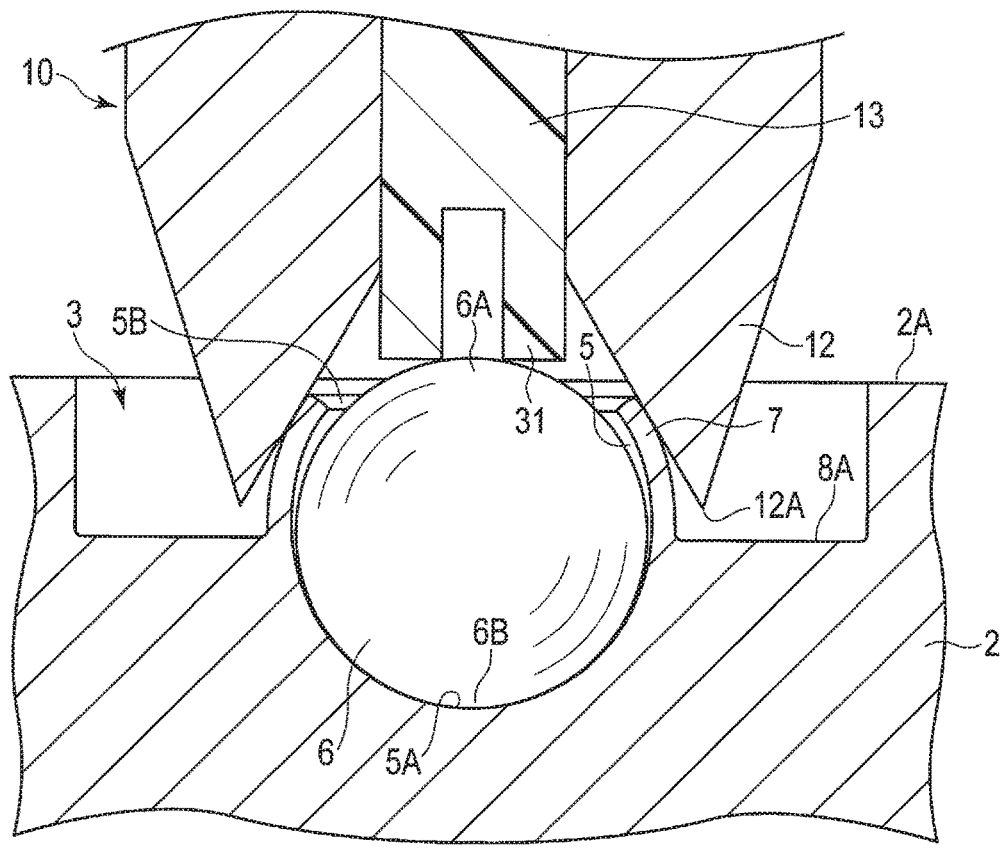
FIG. 15 is a cross-sectional view showing a manufacturing method of the present invention applied to a hole shown in FIG. 14.

FIGS. 14 and 15 show a modification of the above manufacturing method, and FIG. 14 illustrates the perforation step, and FIG. 15 shows the caulking step.

In the modification, in the perforation step, a recessed portion 8A is formed instead of the spot facing portion 8. The recessed portion 8A is formed deeper than where the blade edge 12A is lowered in the caulking step shown in FIG. 15 around the edge portion 5B of the hole 5.

Also in the modification, the substrate supporting apparatus 1 can be manufactured by using the caulking jig 10 of the present embodiment. Further, in the modification, because of the recessed portion 8A which extends to a deeper point than where the blade edge 12A reaches, the groove 9 does not need to be formed. Accordingly, the edge portion 5B can be more easily plastically deformed than in the present embodiment. Consequently, even if the plate member 2 is a hard metal, the caulking portion 7 can be formed without applying an excessive load to the NC machine tool 100 or the blade edge 12A of the caulking jig 10.

Next, a caulking jig according to second to fourth embodiments, and a manufacturing method using such a caulking jig will be explained. Note that for the structures having functions which are the same as or similar to the structures of the caulking jig of the first embodiment, the descriptions of the first embodiment, in which the same reference numbers are added to show correspondence, should be referred to, and duplicated explanation will not be provided here. Further, structures other than those described below are the same as the structures of the first embodiment.

Second Embodiment

A second embodiment will be explained with reference to FIG. 16. The second embodiment is different from the first embodiment in that a caulking jig 10 comprises a load sensor 51 connected to a projection member 13.

In the second embodiment, a load exerted on the projection member 13 against the urging force of an urging member 14 can be measured by a load sensor 51.

Since a distal end portion 31 of the projection member 13 is projected more outwardly than a blade edge 12A of a blade portion 12, when a spacer member 6 is accommodated in a hole 5 as shown in FIG. 10, the projection member 13 contacts the spacer member 6 before the blade edge 12A contacts an upper surface of a plate member 2, and a load is measured by the load sensor 51.

Figure 16:
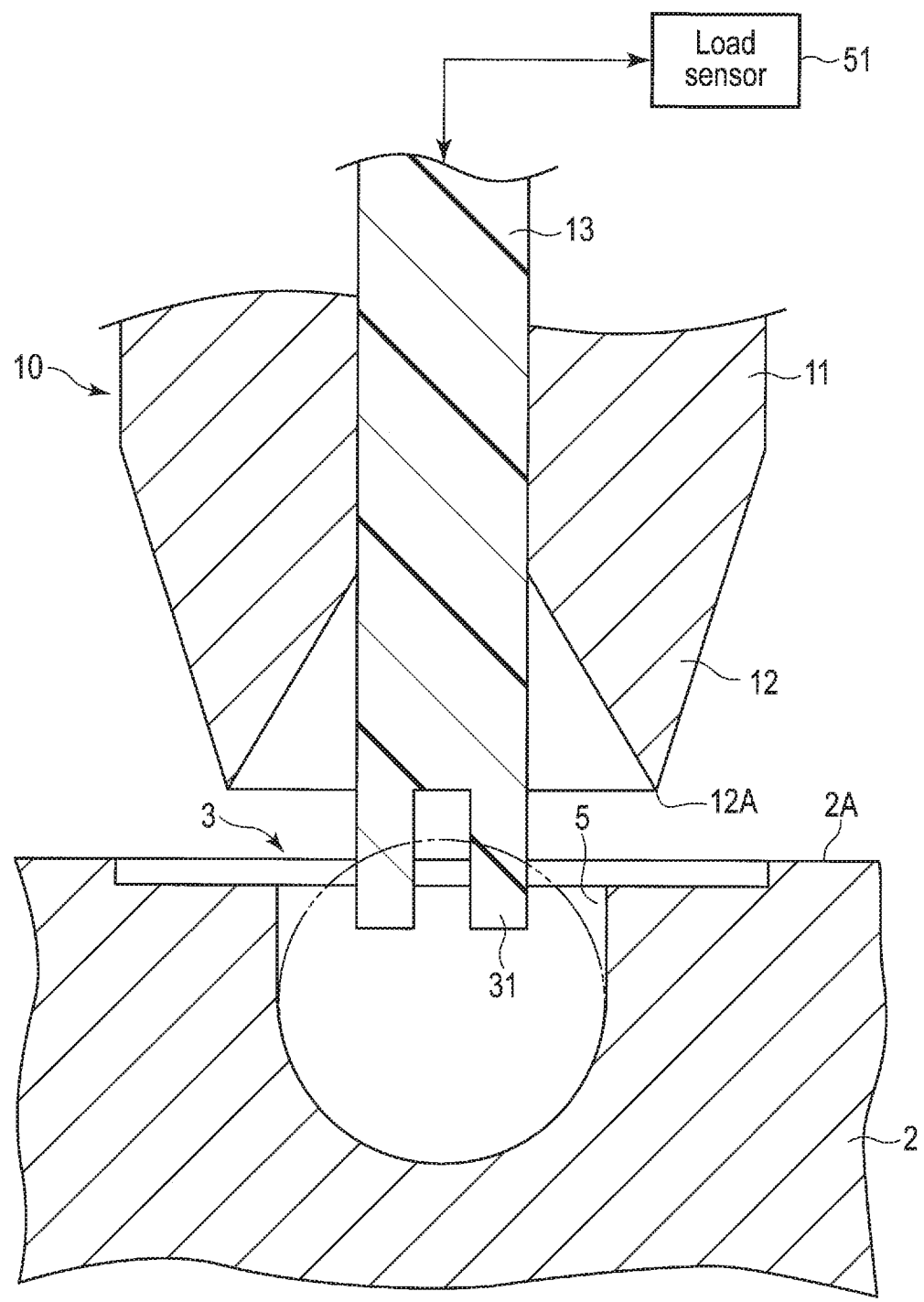
FIG. 16 is a cross-sectional view schematically showing a caulking jig of a second embodiment.

Meanwhile, when the spacer member 6 is not accommodated in the hole 5 as shown in FIG. 16, a load is not measured by the load sensor 51. The presence or absence of the spacer member 6 accommodated in the hole 5 can be detected based on whether a load is measured by the load sensor 51. In the spacer position correction step shown in FIG. 10, when a spindle head 101 of an NC machine tool 100 is lowered to a predetermined position in the third direction Z, the presence or absence of the spacer member 6 accommodated in the hole 5 may be detected by the load sensor 51, and lowering of the caulking jig 10 may be suspended by not proceeding to the caulking step shown in FIG. 11. One example of the predetermined position is a position where the distal end portion 31 of the projection member 13 has already abutted on an upper end portion 6A of the spacer member 6 as shown in FIG. 10, and is a position where the blade edge 12A has not yet contacted the upper surface of the plate member 2. Since formation of a caulking portion 7 results in irreversible change, if the formation fails, the substrate supporting apparatus 1 cannot be reproduced, and a great loss will be suffered. However, according to the second embodiment, by the load sensor 51, a loss caused by formation failure of the caulking portion 7 can be prevented from occurring.

Third Embodiment

Figure 17:
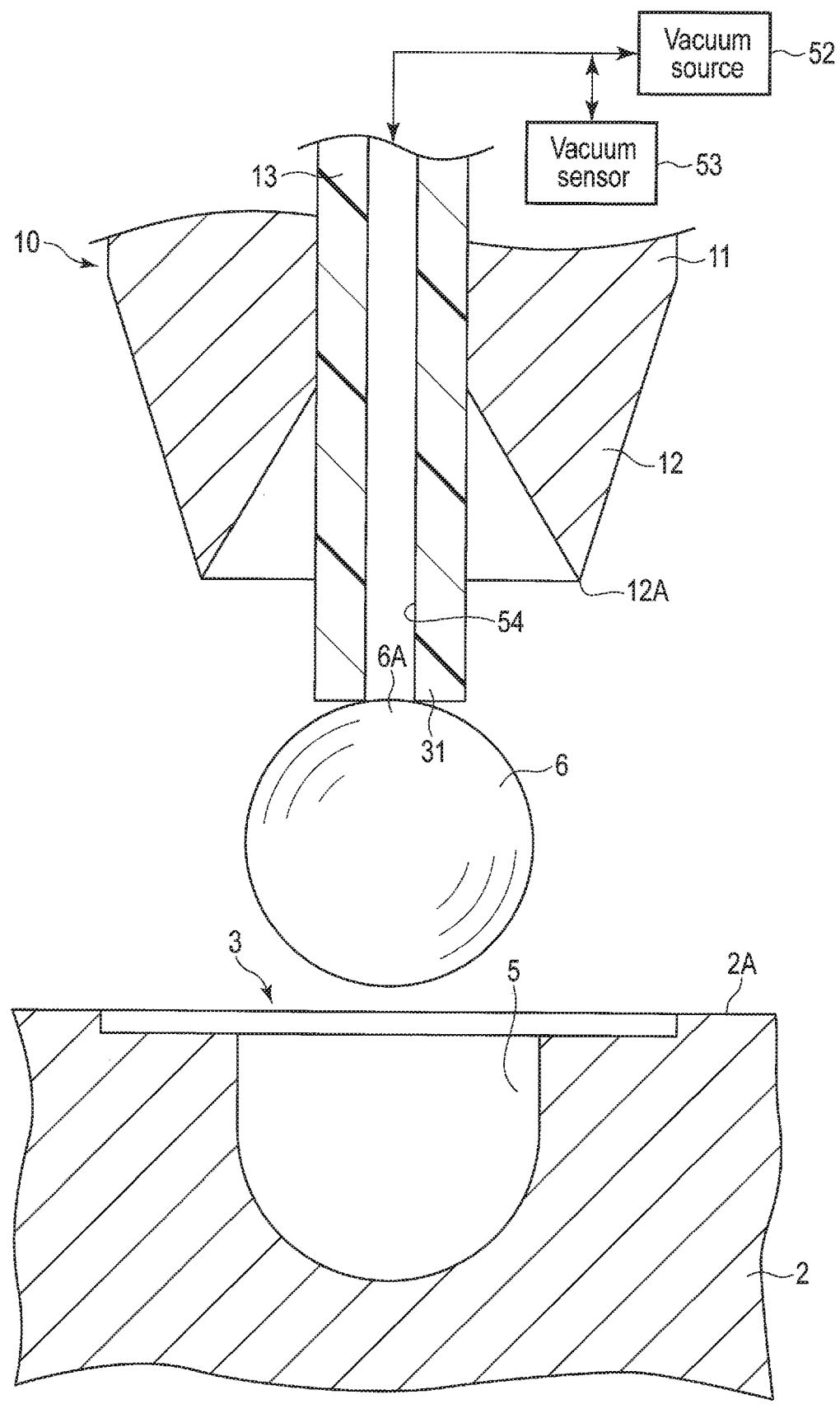
FIG. 17 is a cross-sectional view schematically showing a caulking jig of a third embodiment.

A third embodiment will be explained with reference to FIG. 17. The third embodiment is different from the first embodiment in that a caulking jig 10 comprises a vacuum source 52, and a vacuum sensor 53.

In the third embodiment, a projection member 13 includes a through-hole 54 penetrated from a distal end portion 31 to a guide shaft 35. The guide shaft 35 penetrates through a cover portion 21 of a main body 11, and is connected to the vacuum source 52 arranged outside the main body 11. The vacuum sensor 53 is connected to a path connecting the vacuum source 52 and the projection member 13. The vacuum sensor 53 measures a degree of vacuum inside the through-hole 54.

According to the third embodiment, since the projection member 13 is connected to the vacuum source 52, a spacer member 6 can be adsorbed to the distal end portion 31 of the projection member 13. When a spindle head 101 and a table 102 of an NC machine tool 100 are moved while the spacer member 6 is being adsorbed, the spacer member 6 can be carried to an arbitrary spacer arrangement portion 3 of a plate member 2. By inputting information on a position of the spacer arrangement portion 3 to the NC machine tool 100, the spacer member 6 can be automatically carried to a hole 5 of the spacer arrangement portion 3.

Further, if the spindle head 101 is lowered to the state of FIG. 11 directly, in succession to the operation of lowering the spindle head 101 of the NC machine tool 100 in order to accommodate the adsorbed spacer member 6 in the hole 5, a caulking portion 7 can be formed simultaneously with carrying of the spacer member 6. In other words, the spacer arrangement step shown in FIG. 7 can be omitted.

If the spacer member 6 adsorbed to the projection member 13 is dropped during the carrying, the vacuum sensor 53 connected to the path between the projection member 13 and the vacuum source 52 can detect this. At this time, similarly to the second embodiment, by stopping formation of the caulking portion 7, that is, by stopping the apparatus, a loss caused by formation failure of the caulking portion 7 can be prevented from occurring.

Fourth Embodiment

Figure 18:
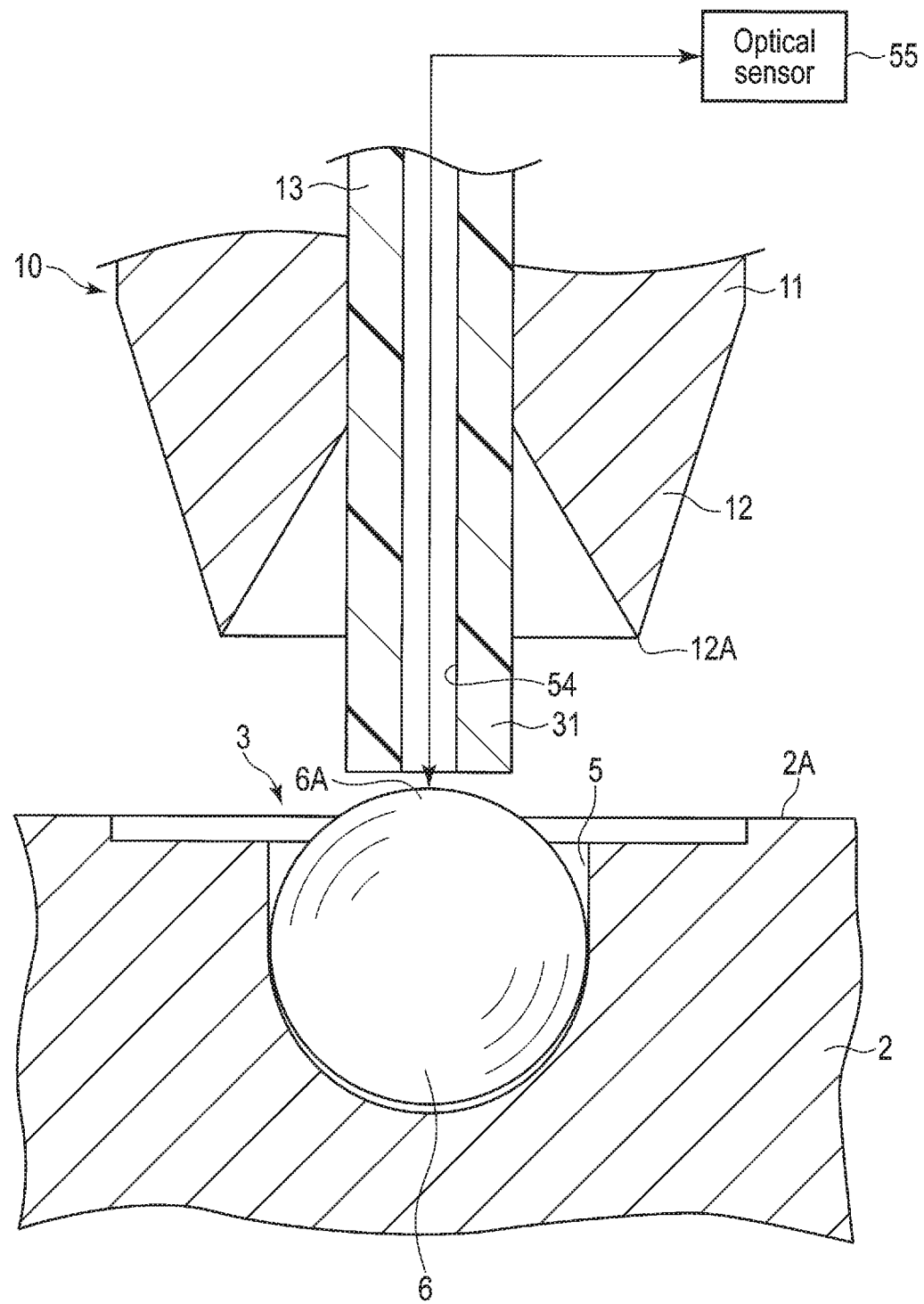
FIG. 18 is a cross-sectional view schematically showing a caulking jig of a fourth embodiment.

A fourth embodiment will be explained with reference to FIG. 18. The fourth embodiment is different from the first embodiment in that a caulking jig 10 comprises an optical sensor 55.

In the fourth embodiment, likewise the third embodiment, a through-hole 54 penetrated from a distal end portion 31 of a projection member 13 to a guide shaft 35 is formed in the projection member 13. The optical sensor 55 measures a reflectivity of light on an extension of the distal end portion 31 of the projection member 13 through the through-hole 54.

According to the fourth embodiment, the presence or absence of a spacer member 6 on the extension of the distal end portion 31 can be detected by the optical sensor 55. Accordingly, likewise the second and third embodiments, it is possible to prevent a loss caused by formation failure of a caulking portion 7 from occurring.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, while a blade portion is structured in a continuous annular shape, it may be structured by arranging a plurality of (for example, three) blade edges spaced apart from each other at regular intervals annularly. In that case, in accordance with the shape formed by the blade edges, an edge portion may be formed in a discontinuous annular shape. While the shoulder portion of the projection member is formed into a conical shape which is smoothly continuous with the shaft part, the shoulder portion may be a brim or a protrusion projecting radially from the shaft part.

What is claimed is:

1. A caulking jig comprising:
a cylindrical main body having an opening at a distal end thereof;
a blade portion provided at the distal end of the main body, and having a V-shaped blade edge that extends around the opening;
a projection member internally fit in the main body, the projection member including a distal end portion and a shoulder portion that has a larger diameter than the distal end portion, and the projection member being movable between (i) a first position at which the distal end portion of the projection member projects through the opening past the blade edge and (ii) a second position at which the distal end portion of the projection member is retracted into the opening with respect to the blade edge;
a coil spring which urges the projection member in a direction towards the first position; and
an engagement mechanism comprising an engagement hole which penetrates the main body, and an engagement pin which is insertable into the engagement hole to an engagement position at which the engagement pin engages with the shoulder of the projection member to hold the projection member at the second position, the engagement pin being removable from the engagement position to allow the coil spring to move the projection member to the first position.

2. The caulking jig of claim 1, wherein:
the engagement hole is positioned on a plane orthogonal to a central axis of the main body, and the engagement hole penetrates the main body at a position of a chord not intersecting the central axis; and
the engagement pin, when engaged with the shoulder of the projection member, contacts the shoulder portion of the projection member at a side opposite to a side of the projection member where the coil spring is located.

3. The caulking jig of claim 1, wherein the projection member has a recess that is recessed from a surface of the distal end portion of the projection member.

4. The caulking jig of claim 1, further comprising a load sensor which measures a load exerted on the projection member against a force of the coil spring.

5. The caulking jig of claim 1, further comprising a vacuum source connected to the projection member, wherein the projection member includes a through-hole extending therethrough to the distal end portion of the projection member, the through-hole being connected to the vacuum source.

6. The caulking jig of claim 5, further comprising a vacuum sensor which measures a degree of vacuum of the through-hole.

7. The caulking jig of claim 1, further comprising an optical sensor connected to the projection member, wherein:
the projection member includes a through-hole extending therethrough to the distal end portion of the projection member; and
the optical sensor is configured to detect an object at the distal end portion of the projection member by measuring a reflectivity through the through-hole.

8. A method of manufacturing a substrate supporting apparatus using the caulking jig of claim 1, the method comprising:
forming a plurality of holes in a flat upper surface of a metallic plate member;
inserting spacer members into the plurality of holes, respectively;
mounting the caulking jig on a numerically controlled (NC) machine tool;
calibrating a height of the blade portion of the caulking jig in order to input a setting of a predetermined caulking position to the NC machine tool, while holding the projection member is in the second position;
lowering the caulking jig in a state in which the projection member is in the first position, pressing one of the spacer members with the projection member, and causing the spacer member to contact a bottom of the hole; and
further lowering the caulking jig to lower the blade portion to the caulking position against a force of the coil spring on the projection member, and fixing the spacer member by plastically deforming an edge portion of the hole with the blade portion.

9. The method of manufacturing the substrate supporting apparatus of claim 8, further comprising detecting whether or not the spacer member is accommodated in the hole, wherein when the spacer member is not accommodated in the hole, the lowering of the caulking jig is suspended.

10. A system comprising:
(i) a numerically controlled (NC) machine tool;
(ii) a caulking jig which is mounted on the NC machine tool, the caulking jig comprising:
a cylindrical main body having an opening at a distal end thereof;
a blade portion provided at the distal end of the main body, and having a V-shaped blade edge that extends around the opening;
a projection member internally fit in the main body, the projection member including a distal end portion and a shoulder portion that has a larger diameter than the distal end portion, and the projection member being movable between (i) a first position at which a distal end portion of the projection member projects through the opening past the blade edge and (ii) a second position at which the distal end portion of the projection member is retracted into the opening with respect to the blade edge;
a coil spring which urges the projection member in a direction towards the first position; and
an engagement mechanism comprising an engagement hole which penetrates the main body, and an engagement pin which is insertable into the engagement hole to an engagement position at which the engagement pin engages with the shoulder of the projection member to hold the projection member at the second position, the engagement pin being removable from the engagement position to allow the coil spring to move the projection member to the first position; and
(iii) a metallic plate member having a flat upper surface in which a hole is provided, and which has a spacer member accommodated in the hole,
wherein the NC machine tool is configured to lower the caulking jig to a caulking position of the metallic plate member, in a state in which the projection member of the caulking jig is in the first position, to contact the spacer with the projection member, and to plastically deform an edge portion of the hole with the blade portion of the caulking jig, to fix the spacer member in the hole in a state in which an upper end portion of the spacer member projects from the upper surface of the metallic plate member.

11. The system claim 10, wherein, in the caulking jig:
the engagement hole is positioned on a plane orthogonal to a central axis of the main body, and penetrates the main body at a position of a chord not intersecting the central axis; and
the engagement pin, when engaged with the shoulder of the projection member, contacts the shoulder portion of the projection member from a side opposite to a side of the projection member where the coil spring is located.

12. The system claim 10, wherein the projection member of the caulking jig has a recess that is recessed from a surface of the distal end portion of the projection member.

13. The system claim 10, wherein the caulking jig further comprises a load sensor which measures a load exerted on the projection member against a force of the coil spring; and
wherein the load sensor is configured to detect whether the projection member is in contact with the spacer member.

14. The system claim 10, further comprising a vacuum source connected to the projection member of the caulking jig, wherein the projection member includes a through-hole extending therethrough to the distal end portion of the projection member, the through-hole being connected to the vacuum source,
wherein the vacuum source causes the spacer member to be adsorbed to the distal end portion of the projection member.

15. The system of claim 14, further comprising a vacuum sensor which measures a degree of vacuum of the through-hole,
wherein the vacuum sensor is configured to detect whether the spacer member is adsorbed to the distal end portion of the projection member.

16. The system claim 10, further comprising an optical sensor connected to the projection member of the caulking jig,
wherein:
the projection member includes a through-hole extending therethrough to the distal end portion of the projection member; and
the optical sensor is configured to detect whether the spacer member is arranged at the distal end portion of the projection member by measuring a reflectivity through the through-hole.

* * * * *